United States Patent [19]

Drexler

[11] 4,225,659
[45] Sep. 30, 1980

[54] METHOD FOR MAKING THERMOCHROMIC PHOTOMASKS

[75] Inventor: Jerome Drexler, Los Altos Hills, Calif.

[73] Assignee: Drexler Technology Corporation, Mountain View, Calif.

[21] Appl. No.: 28,907

[22] Filed: Apr. 10, 1979

Related U.S. Application Data

[63] Continuation-in-part of Ser. No. 910,113, May 30, 1978, abandoned.

[51] Int. Cl.³ .............................................. G03C 5/00
[52] U.S. Cl. .......................................... 430/5; 430/4; 430/198; 430/321; 430/330; 430/401
[58] Field of Search .............. 96/34, 27 R, 38.3, 66 T, 96/840 V; 427/166; 430/4, 5, 198, 321, 330, 350, 401

[56] References Cited

U.S. PATENT DOCUMENTS

| | | | |
|---|---|---|---|
| 2,911,749 | 11/1959 | Stookey | 96/34 X |
| 3,406,066 | 10/1968 | Avery | 96/34 |
| 3,567,447 | 3/1971 | Chand | 96/36 |
| 3,664,837 | 5/1972 | Stanley | 96/38.3 |
| 3,674,484 | 7/1972 | Spinski | 96/34 |
| 4,004,925 | 1/1977 | Van Besauw et al. | 96/58 |

Primary Examiner—Edward C. Kimlin

[57] ABSTRACT

An orange colored photomask visually transmissive to yellow-orange light formed by heating an exposed and developed silver-halide emulsion coated photomask. At approximately 200° C., black silver in the photomask begins to show evidence of conversion to a transparent red material. At a temperature of 250° C. to 320° C., the black silver opaque images are rapidly converted to orange, visually transmissive images which are essentially opaque to the ultraviolet light used to expose photoresist covered silicon wafers, while clear areas remain clear.

22 Claims, 16 Drawing Figures

U.S. Patent Sep. 30, 1980 4,225,659
EXPOSE
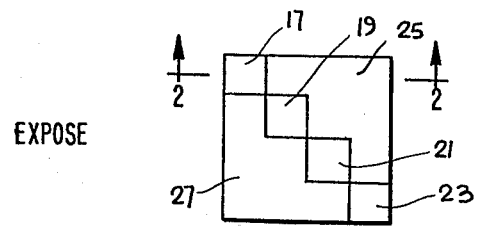
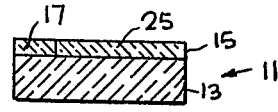
DEVELOP AND FIX
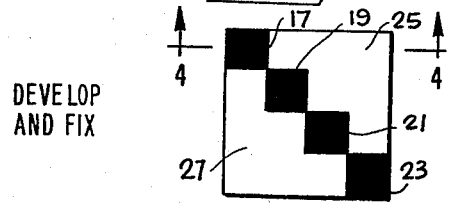
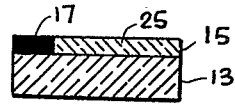
HEAT
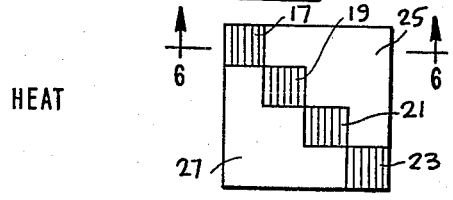
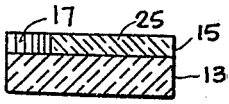
EXPOSE
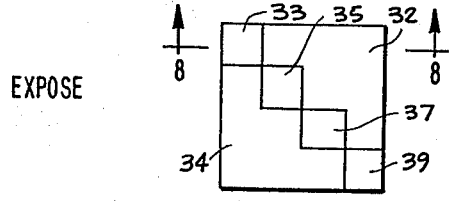
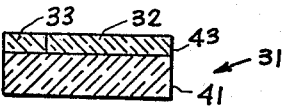
DEVELOP
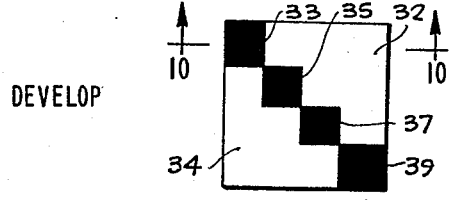
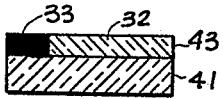

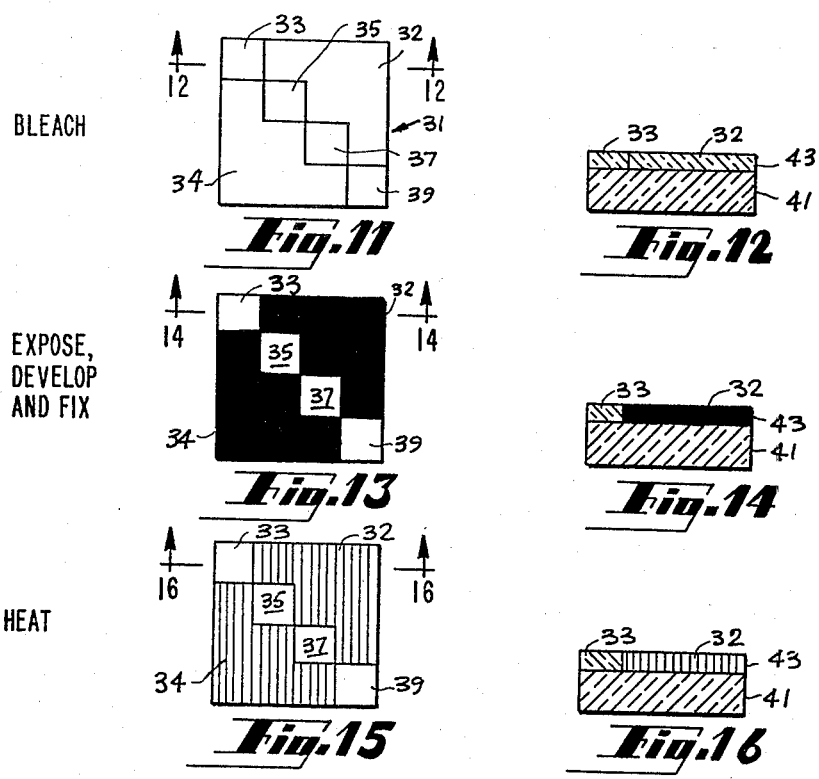

METHOD FOR MAKING THERMOCHROMIC PHOTOMASKS

CROSS REFERENCE TO RELATED APPLICATION

This is a continuation-in-part of patent application Ser. No. 910,113, filed May 30, 1978, now abandoned.

BACKGROUND OF THE INVENTION a. Field of the Invention

The invention relates generally to methods for making photomasks and more particularly to methods for making thermochromic photomasks.

b. Prior Art

The process of manufacturing integrated circuits involves several distinct steps: (i) circuit design, (ii) reticle plate generation, (iii) master photomask preparation, (iv) production of sets of photomasks from photoplates, (v) wafer fabrication, and (vi) wafer slicing, testing and packaging.

Circuit design defines the electrical characteristics of the integrated circuit to be contained on a chip of silicon, and determines the number of photomasks, usually about seven, necessary to produce a complete integrated circuit. Several hundred identical integrated circuits can be manufactured simultaneously on a thin disc of silicon, called a "wafer". A circuit design drawing is usually prepared by the integrated circuit manufacturer. The design drawing is then employed for reticle plate generation and photomask production.

This circuit design drawing is translated to digital information on magnetic tape which is then used to generate a set of individual high precision reticle plates for each integrated circuit. These reticle plates are used to produce master photomasks which contain the design details of electronic circuit elements which will be transferred to a silicon wafer.

The digital information on the magnetic tape controls a precision pattern generator which produces the reticle plates. The negative of the circuit image which appears on the reticle plate is further reduced to actual size and is photographically repeated a like number of times on a single photoplate to produce a master photomask. The master photomask is approximately the same size as the silicon wafer to be processed. Each master photomask is utilized through high-precision photographic printing techniques to produce many photomasks which are exact reproductions of the master photomask and are used in the wafer fabrication of integrated circuits.

Wafer fabrication by the integrated circuit manufacturer consists of a series of chemical and physical processes in which the photomask images are transferred to the wafer, which is typically three inches in diameter and coated with ultraviolet radiation sensitive photoresist. Exposure to high-intensity ultraviolet radiation results in the transfer of the images on the photomask to the wafer. This is accomplished in a room lighted by a yellow-orange light to avoid exposing the photoresist coating the wafers to any ultraviolet light. Additional chemical processing, including etching, and the selected introduction of chemical impurities impart to the wafer the properties necessary to form electronic elements such as transistors. This process is repeated with each of the individual photomasks in a defined sequence, to produce all of the required parts of the many identical integrated circuits being produced on the wafer. Wafer fabrication is completed by the precision etching of a layer of aluminum previously deposited on the wafer, which results in the desired pattern of electrical interconnections of the numerous electronic elements contained in each of the individual integrated circuits.

A completed wafer may contain 500 identical integrated circuits. Each individual integrated circuit is tested and those not meeting specifications are marked for rejection. The individual integrated circuits are separated from the wafer and the rejected integrated circuits are discarded. Each remaining integrated circuit, or chip, is individually assembled and mounted in a circuit interconnection package.

Previously, it was recognized that there was an advantage in using photomasks having image areas which were transmissive in yellow-orange spectral regions while the same areas were opaque to ultraviolet light. The advantage of such a mask is that it may be readily aligned visually in a yellow-orange lighted room by an operator, with previously deposited patterns on a wafer.

A sequence of several masks is used in the manufacture of integrated circuits and sometimes masks must be superposed over wafer patterns which may only partially define larger patterns. It is typical that masks which are used to develop subsequent wafer patterns must be aligned with previously developed and processed wafer patterns made with other masks. One type of yellow-orange transparent mask of the prior art in which alignment is easier is the iron oxide mask. In this type of mask a glass substrate has a thin iron oxide coating which in turn is coated with a positive or negative photoresist layer which is exposed by light to an image pattern. The exposure changes the solubility of the photoresist so that a developer can remove unwanted photoresist portions. Underlying iron oxide portions may then be etched away through the opening in the photoresist.

The remaining mask photoresist may be stripped away, leaving islands of iron oxide forming the desired wafer masking patterns. The iron oxide image areas on glass are transmissive to yellow-orange light, but essentially opaque to the ultraviolet used, while the clear areas are transparent to visible and the ultraviolet light used. While this type of photomask has advantages, it is considered to be costly, presently selling for approximately twenty-five dollars per finished mask, compared to about four dollars for a silver-halide emulsion mask.

In U.S. Pat. No. 4,004,925 Van Besauw et al. teach the advantage of transparent emulsion masks. The patent describes a post processing chemical technique in which diazonium, pyrylium or thiapyrylium salts combine with silver-halides to form image areas transparent to visible light of wavelengths longer than 500 nanometers but opaque to ultraviolet in an emulsion mask.

N. Chand, in U.S. Pat. Nos. 3,567,447 and 3,639,125, teaches that while heating a processed silver-halide emulsion photomask to achieve differential solubility, the non-image areas (clear gelatin) darken to a reddish color. This darkening is thought to be a charring of the clear gelatin. In the reference Chand patents the clear gelatin is charred after being heated for one hour and apparently becomes more soluble in certain chemicals.

In U.S. Pat. No. 2,911,749 Stookey teaches the making of photographs on glass using a preferred temperature of 525° C. for more than one hour. The image areas are opaque.

In U.S. Pat. No. 3,406,066 Avery teaches the conversion of photographic images to metallic ferrocyanides which yield colored oxides on firing at a temperature greater than 1,000° C. for an apparently long duration. The image areas are opaque.

In U.S. Pat. No. 3,664,837 Stanley teaches production of line patterns on glass plates by heating to a temperature of between 400° C. and 500° C. for an unknown duration. The image areas are opaque shiny silver.

In U.S. Pat. No. 3,674,484 Spinski teaches production of photographic images on ceramic by heating to a temperature range between 670° C. and 815° C. for 10 hours. The image areas are opaque black silver.

On another point in the prior art, the literature states that during the interaction of silver ions with gelatin in a homogeneous medium, there are formed thermally-stable complex compounds of silver ions and gelatin. It is unknown whether the silver is adsorbed into the gelatin or whether a compound of some type is formed. These materials are referred to as silver-gelatin complexes. (*The Chemistry of Photographic Mechanisms* by K. L. Lyalikov, Focal Press, 1967, pages 274–275.)

SUMMARY OF THE INVENTION

An object of the present invention was to make a silver-halide emulsion coated photomask which is produced in essentially the normal way and then by means of an added processing step becomes visually transmissive to yellow-orange light in both silver and non-silver clear areas, but opaque in the silver areas to wavelengths of ultraviolet normally used to expose the photoresist of silicon wafers, thus permitting both visual alignment and masking of an ultraviolet exposure of a photoresist coated silicon wafer.

This object is achieved by the conversion of a black silver photomask to an orange colored photomask which is visually transmissive to yellow-orange light by heating for at least 10 seconds at near 320° C. or up to 3 minutes at near 250° C. or any combination of time and temperature therebetween in air or a relatively inert gas, such as nitrogen or carbon dioxide. The amount of time required depends upon how the heat is transferred into the mask, and the silver content in the emulsion and also the permissible thermal shock to the substrate. Heating methods include the use of a convection oven, contacting hot source, or radiant heating. Greater light transmission occurs in the yellow-orange region if the photomask is heated in a relatively inert gas which doesn't contain free oxygen, such as nitrogen or carbon dioxide.

In accord with the method of the present invention, the optical density of photomasks in the yellow-orange spectrum is permanently reduced by heating while the optical density in the blue and near ultraviolet is not reduced significantly.

BRIEF DESCRIPTION OF THE DRAWINGS

FIG. 1 is a top view of a photoplate having a photomask latent image thereon.

FIG. 2 is a side sectional view taken along the lines 2—2 in FIG. 1.

FIG. 3 is another top view of the photomask of FIG. 1 with image areas of the emulsion developed and fixed.

FIG. 4 is a side sectional view of the photomask of FIG. 3 taken along the lines 4—4.

FIG. 5 is a top view of the photomask of FIG. 3 after heating of said photomask.

FIG. 6 is a side sectional view of the photomask of FIG. 5 taken along the lines 6—6.

FIG. 7 is an emulsion coated photoplate having a latent image of a photomask therein.

FIG. 8 is a side sectional view of the photoplate of FIG. 7 taken along the lines 8—8.

FIG. 9 is a top view of the photomask of FIG. 7 after developing.

FIG. 10 is a side sectional view of the photomask of FIG. 9 taken along the lines 10—10.

FIG. 11 is a top view of the photomask of FIG. 9 after bleaching.

FIG. 12 is a side sectional view of the photomask of FIG. 11 taken along the lines 12—12.

FIG. 13 is a top view of the bleached photomask of FIG. 11 after re-exposing and developing.

FIG. 14 is a side sectional view of the photomask of FIG. 13 taken along the lines 14—14.

FIG. 15 is a top view of the photomask of FIG. 13 after heating.

FIG. 16 is a side sectional view of the photoplate of FIG. 15 taken along the lines 16—16.

DESCRIPTION OF THE PREFERRED EMBODIMENTS

The following are examples of preferred embodiments of the invention:

EXAMPLE I

Example I is described with reference to FIGS. 1–6 of the drawings. With reference to FIG. 1, a commercially available emulsion coated photoplate manufactured by Konishiroku Photo Industries is provided for receiving the latent image of a mask. With reference to the sectional view of FIG. 2, the photoplate 11 may be seen to have a substrate 13 which is made of a material which is transparent to visible light such as glass and is coated by a thin transparent silver-halide emulsion 15. The thickness of the transparent emulsion 15 is approximately three microns. Returning to FIG. 1, a photomask pattern is applied to the photoplate 11 as a latent image represented by the squares 17, 19, 21, 23. These squares are an arbitrary pattern in this embodiment and are known as the silver image areas. They will define the portions of the finished photomask which are opaque to ultraviolet light, but visually transmissive to yellow-orange light. The remaining portions of the photomask are known as the non-silver, non-image areas. The non-image areas 25, 27 will be transparent to visible and ultraviolet radiation in the finished photomask.

With reference to FIG. 1, the thin emulsion layer coating the photoplate consists of gelatin with a suspension of silver halide. The silver halide is photosensitive, and light images passing through a master photomask create latent images on the photoplate. With reference to FIG. 3, upon photographically developing this exposed photoplate, the silver halide is converted to black silver. The developer is formulated in accord with conventional developing chemicals suggested by the photoplate manufacturer. After a sufficient degree of blackness is achieved in the image areas by the development, the photomask is fixed in accord with conventional techniques suggested by the manufacturer. The photomask now has a black silver image area formed in the regions 17, 19, 21, 23 on the surface of the photomask, while the non-image areas 25, 27 remain transparent to visible and the ultraviolet exposure radiation. This is conventional negative photographic processing.

With respect to the sectional view of FIG. 4, the opaque black silver region 17 may be seen to completely occupy the emulsion layer.

After development, the photomask is heated in an oven, or by a hot gas stream, or by radiant heating, or on a contacting hot plate, to a temperature of between 250° C. and 320° C. for a time ranging between 10 seconds to 3 minutes depending upon how the heat is applied and the permissible thermal shock to the substrate. The image areas become transmissive to red, orange and yellow light but remain opaque to the ultraviolet exposure radiation as shown in FIGS. 5 and 6.

The degree of conversion of the black silver to an orange transmissive silver-gelatin complex is a function of temperature and time and the silver density. At 200° C. the black silver regions of the photoplate start turning red when heated for 10 minutes or longer, which can be observed by back lighting the emulsion with an intense light. At 220° C. the black silver assumes a reddish color when heated for 10 minutes, but is not yet fully transparent to red light. At higher temperatures of 300° C. to 320° C. for 10 seconds to 1 minute, the black silver is completely converted to an orange-red or orange color in air and is sufficiently transparent that newspaper type can be seen through the image areas. If a nitrogen or carbon dioxide atmosphere, or any other inert non-oxygen containing gas, is used during a two minute conversion cycle the image areas transmit about twice as much orange or yellow light, making alignment easier to accomplish. If heating continues for longer times in air at 320° C. the orange areas become less and less visually transmissive and ultimately become visually opaque. Also, the non-image areas which were formerly clear will begin to become darkened to a charred red gelatin or gelatin compound when the heating is done at 320° C. and extends beyond a few minutes. This effect was previously noted by Chand in U.S. Pat. No. 3,567,447. The extended heating at this high temperature is to be avoided because the object of the present invention is to provide a photomask in which the non-image (clear) areas are clear gelatin, which is transparent in the visible and ultraviolet. It should also be noted that the problems of charring or the red areas becoming visually opaque may be alleviated by shorter conversion times at the high temperature limit or by lower temperature conversion of the photomask at about 260° C. for 1 to 1½ minutes, or by previously lowering the silver density as described in Examples II and III to shorten the conversion time, or by converting the photomask in a nitrogen or carbon dioxide or other inert atmosphere.

Since the image areas are visually transmissive to yellow-orange light, but opaque to ultraviolet and the non-image areas are transparent to both visible and ultraviolet, the photomask will function in the traditional manner for transferring photomask images to a wafer for manufacturing integrated circuits. While the image area formed by region 17, 19, 21, 23 has been shown to consist of a checkerboard square pattern, this is an arbitrary pattern adopted for demonstration purposes only. In reality, the image areas are microscopically small.

EXAMPLE II

With reference to FIG. 7, an emulsion coated photoplate 31 of the same type used in Example I is shown to have an image area defined by regions 33, 35, 37, 39. These image regions arise from the exposure of the photoplate to light utilizing conventional photographic techniques. In FIG. 8, the photoplate 31 is shown to have a substrate of 41 and a thin emulsion coating 43 which, as previously mentioned, is approximately three microns thick.

In FIG. 9, the photoplate is shown to have been developed utilizing conventional developing in chemicals recommended by the manufacturer of the photoplate so that the latent image in the image area defined by regions 33, 35, 37, 39 is converted to opaque black silver. The non-image areas 32, 34 remain transparent to visible and ultraviolet radiation. In FIG. 10, it can be seen that the black silver region 33 extends completely through the emulsion 43 to the substrate 41.

With reference to FIG. 11, the photoplate 31 has been completely bleached by removing the black silver. The bleach which is utilized should not affect silver-halide non-image areas 32, 34, thereby leaving the image area regions 33, 35, 37, 39 occupied by gelatin which is transparent. This is illustrated in FIG. 12 wherein the emulsion layer 43 is seen to cover the substrate 41. Now however, the former image region 33 is transparent to visible and ultraviolet radiation.

With reference to FIG. 13, the photoplate 31 has now been exposed and developed. Previously, it was protected from light except during the exposure of the former image regions 33, 35, 37, 39. Now the exposed non-image areas 32, 34 have been processed until black silver occupies the former non-image areas. This processing may be accomplished by one of two ways. First it may be processed by an additional exposure and development step until maximum blackness is achieved. Alternatively, it may be processed by use of a fogging developer. This is illustrated in FIG. 13 and also in FIG. 14 where it is seen that the black silver exists through the depth of the emulsion layer in non-image area 32. FIGS. 13 and 14 illustrate what is known as a reversal processed photomask.

To lower the black density in this process the final exposure may be reduced or a weak fogging developer can be used to achieve the same effect. This procedure, which is described in detail in Example III, may not always yield images having adequate uniformity of density. To accomplish a similar effect but with better image density uniformity, an additional weak fogging exposure may be used to illuminate the entire mask either just before or just after the initial exposure of the mask pattern as shown in FIG. 7. After the first development, the bleaching step commmon to reversal development is used, but in this case it removes the fog-created silver in the non-image areas as well as the silver in the image areas. Thus, the final exposure and development results in gray-black image areas rather than dense black image areas. Note that in the situation where the mask pattern exposure is to be applied at an unknown time after an initial weak exposure is used, the weakly exposed photoplate should be aged for a minimum of a few days to allow the decay of the latent image of the pre-fogged silver-halide emulsion and its exposure sensitivity to stabilize.

The reversal processed photomask is now heated as described in Example I, preferably to a temperature of between 300° C. and 320° C. for a time of 10 seconds to one minute or at about 260° C. for 1 to 1½ minutes in air, nitrogen, or carbon dioxide or other inert atmospheres. The preferred method of making these photomasks is by using non-oxygen heating atmospheres, although oxygen containing atmospheres such as air will work. The benefit of using these non-oxygen containing atmospheres is that the photomasks produced are more visually transmissive. This causes the black non-image areas 32, 34 in FIGS. 15 and 16 to become transmissive orange in color and the image area formed by region 33, 35, 37 and 39 to remain clear. The orange areas are a silver gelatin complex, while the clear, non-silver areas are transparent gelatin.

EXAMPLE III

Example III, which is referred to in Example II, demonstrates that a highly transmissive orange image area color can be achieved by lowering the black silver density through reduced light exposure prior to photographic development. The non-silver areas remain clear. Although this method may not achieve the image density uniformity of the fogging exposure method described in Example II, it is adequate for less than the highest resolution images. In general there are two situations where the black density may be too great for adequate see-through capabilities after thermochromic conversion, that is, when thicker emulsions are used or when lower conversion temperatures are desired. In the previously described experiments, a Konishiroku plate with a 3-micron thick emulsion was used. A very dense black was achieved by a saturation light exposure. When using either Eastman Kodak photoplates with their 6-micron thick emulsions or Agfa-Gevaert photoplates with their 4½ micron thick emulsions, the amount of yellow-orange light transmission obtained through silver areas may not be adequate under normal circumstances to do visual alignment under a yellow-orange ambient light condition.

The desired visual alignment capability for both Eastman Kodak and Agfa-Gevaert materials can be achieved by lowering black silver density in the image areas by the method of Example II or by reducing the light exposure level prior to processing. This procedure permits the total orange conversion to take place at a temperature as low as 250° C., which has the advantages of allowing simpler types of heating methods, reducing emulsion charring. Substrates which do not deform or discolor at that temperature should be used. Glass has these properties.

The procedure is as follows. An Agfa-Gevaert Millimask HD (Millimask HD is a trademark of Agfa-Gevaert) emulsion photoplate with a 4½ micron thick emulsion, or similar photoplate is exposed, for example, in a contact printer for 10 seconds. The latent image of the photomask is then brought out by standard reversal processed development as in Example II. The photomask is then placed in a conventional bleaching bath and clearing bath. As is done in conventional manufacture of a reversal processed photomask, the plate is exposed again; however, the exposure in this case is approximately 7 seconds (6 to 8 seconds), or about 70 percent of the normal exposure time to reduce the amount of the black silver. The photomask is then processed in a conventional developer and a photomask fixer. This lower silver concentration permits conversion from dark gray to the desired orange color by radiant heating at about 260° C. for 1 to 1½ minutes in an air, nitrogen, or carbon dioxide atmosphere, preferably in the inert atmosphere. The yellow-orange light transmission of this material as determined by spectrophotometer testing is in the same general range as that of the Konishiroku plate of Example I and the first four paragraphs of Example II.

The conversion from the black silver to a transmissive orange layer which appears to be a silver gelatin complex results in a greater light transmission in the yellow-to-orange region if a nitrogen atmosphere is used as compared to an air atmosphere. Experimental strips from an Agfa-Gevaert plate where converted at 280° C. for 2 minutes, with one strip being converted in air and another strip being converted in nitrogen. Spectral transmission was measured from 540 nanometers to 700 nanometers. At longer wavelengths, the transmission of both exceeded 65 percent, and at shorter wavelengths the transmission was less than a few percent. Over most of this range, the strip processed in air transmitted about one-half of the amount of light transmitted through the strip processed in nitrogen. The percentage transmissions after processing, relative to an initial optical density of 3 are as follows:

TABLE 1

| Wavelength in Nanometers | Plate Processed in Air | Plate Processed in Nitrogen |
|---|---|---|
| 540 | 1.5% | 3% |
| 550 | 2% | 5% |
| 560 | 4% | 10% |
| 570 | 6.5% | 15% |
| 580 | 9% | 20% |
| 590 | 13.5% | 27% |
| 600 | 18% | 34% |
| 610 | 23% | 38.5% |
| 620 | 29% | 45% |
| 630 | 35% | 50% |
| 640 | 40% | 55% |
| 650 | 45% | 59% |
| 660 | 50% | 64% |
| 680 | 58% | 68% |
| 700 | 66% | 74% |

The importance of the factor of 2 in increased light transmission in the nitrogen processed plate, compared to air, is that when one attempts to align a mask pattern with a wafer pattern below or behind it, the yellow-orange light utilized in such a visual alignment operation must pass through the mask twice; that is, the ambient light goes through the orange-colored mask to the pattern below it, and the light is then reflected and scattered from that pattern back through the plate to the eye. Thus, a factor of 2 difference in one-way light transmission is a factor of 4 in two-way light transmission.

Following the above described examples, silver-gelatin areas in each case are adequate at approximately 560–700 nanometers for visual alignment in yellow-orange light but substantially opaque to ultraviolet light, less than 400 nanometers. Non-silver areas are preferably clear, but if heated over 320° C., or at 320° C. for more than a few minutes, may become reddish in color and thus somewhat opaque to ultraviolet light. The thermally converted silver areas are apparently pure silver gelatin complexes inasmuch as no chemical treatment is required to make the photomasks of the present invention. This yields advantages in simplicity of manufacture and cost.

From another viewpoint, the present invention is useful for converting black, exposed and processed, high resolution emulsion coated substrates from light transmission at 630 nanometers of 1 percent or less (optical density of 2.0 or greater) before conversion by heating, to light transmission at 630 nanometers increased by at least a factor of 20 after heating occurs in a nitrogen atmosphere, as described herein. Sample data is set forth in Table 2, wherein a three micron thick emulsion coated photoplate is heated at 280° C. for two minutes in a nitrogen atmosphere. Different optical densities for the starting material were achieved by different light exposures, prior to processing.

It should be noted that the gelatin in the non-image areas remain substantially light transmissive and in place, although there is a slight amount of shrinkage in its thickness and loss of moisture. Although in the thermal process the gelatin loses its moisture and becomes thinner, it maintains its transmissivity in its clear areas to near ultraviolet light. Its micro-images are preserved and remain in place as determined by measurements to tens of micro inches.

TABLE 2

| Measured Optical Density | Equivalent Light Transmission (Before Conversion) | Measured Light Transmission at 630 nm after Conversion | Ratio of Black to Red-Orange Transmissivity |
|---|---|---|---|
| 1.48 | 3.3% | 18% | 5.5 |
| 1.79 | 1.1% | 20% | 18 |
| 2.36 | 0.44% | 27% | 61 |
| 2.42 | 0.37% | 19% | 51 |
| 2.62 | 0.24% | 22% | 92 |

From Table 2 it is seen that, as a general rule, a greater ratio of black to red-orange transmissivity occurs for initially more optically dense starting material. The lowest useful increase in transmissivity occurs with optical density just below 2 and greater.

It will be realized by those skilled in the art that various means of heating could be used herein without departing from the invention described herein.

The term "photomasks", as used herein, means information photographically recorded on photoplates and is not restricted to any particular type of information, such as circuit structures. For example, the information could be data recorded in image and non-image patterns. Such data could be digital data or analog data.

While the photomasks of the present invention have primary utility because they can be used in a room lighted by a yellow-orange light, they could be useful in other types of light, such as daylight or normal indoor lighting, for alignment testing.

What is claimed is:

1. A method for making a photomask having silver and non-silver areas with said silver areas visually transmissive to yellow-orange light and opaque to ultraviolet radiation, the non-silver areas transparent to visible light and ultraviolet radiation comprising,
    producing a photomask pattern by exposing to actinic radiation and developing an image pattern in a silver-halide emulsion on a photoplate with resulting silver and non-silver areas,
    heating said emulsion to a temperature within a 250° C. to 320° C. range for 10 seconds to 3 minutes until such time as the silver areas become visually transmissive to yellow-orange light and the gelatin of the non-silver areas remains essentially clear.

2. The method of claim 1 further defined by producing said photomask pattern by negative photographic processing.

3. The method of claim 1 further defined by producing said photomask pattern by reversal photographic processing.

4. The method of claim 1 further defined by controlling the amount of silver prior to heating by means of exposing said silver-halide emulsion to a light level less than for saturation exposure.

5. The method of claim 1 further defined by heating said emulsion in a nitrogen atmosphere.

6. The method of claim 1 further defined by heating said emulsion in an air atmosphere.

7. The method of claim 1 further defined by heating said emulsion in an inert gas atmosphere.

8. The method of claim 3 wherein said reversal photographic processing includes using a fogging exposure over the entire photomask after the step of exposing a photomask pattern in the silver-halide emulsion, thereby controlling the amount of silver prior to heating.

9. The method of claim 3 wherein the step of reversal photographic processing is further defined by using a fogging exposure over the entire photomask prior to the initial step of exposing a photomask pattern in a silver-halide emulsion thereby controlling the final amount of silver prior to said heating step.

10. The method of claim 1 wherein said heating is by means of radiant heating.

11. The method of claim 1 wherein said heating of said emulsion is to a temperature within a 250° C. to 300° C. range for between one minute to 1½ minutes.

12. The method of claim 1 wherein said heating of said emulsion is to a temperature within a 300° C. to 320° C. range for between 10 seconds to 1 minute.

13. A method for making a photomask having silver and non-silver areas with said silver areas visually transmissive to yellow-orange light and opaque to ultraviolet radiation, the non-silver areas transparent to visible light and ultraviolet radiation, comprising,
    producing a photomask pattern by exposing to actinic radiation and developing an image pattern in a silver-halide emulsion on a photoplate with resulting silver and non-silver areas,
    heating said emulsion until the transmissivity of said emulsion in the silver areas is increased by at least a factor of 20 for light at 630 nanometers and the gelatin of the non-silver areas remains essentially clear.

14. The method of claim 13 further defined by producing said photomask pattern by negative photographic processing.

15. The method of claim 13 further defined by producing said photomask pattern by reversal photographic processing.

16. The method of claim 13 further defined by controlling the amount of silver prior to heating by means of exposing said silver-halide emulsion to a light level less than for saturation exposure.

17. The method of claim 13 further defined by heating said emulsion in a nitrogen atmosphere.

18. The method of claim 13 further defined by heating said emulsion in an air atmosphere.

19. The method of claim 13 further defined by heating said emulsion in an inert gas atmosphere.

20. The method of claim 15 wherein said reversal photographic processing includes using a fogging exposure over the entire photomask after the step of exposing a photomask pattern in the silver-halide emulsion, thereby controlling the amount of silver prior to heating.

21. The method of claim 15 wherein the step of reversal photographic processing is further defined by using a fogging exposure over the entire photomask prior to the initial step of exposing a photomask pattern in a silver-halide emulsion thereby controlling the final amount of silver prior to said heating step.

22. The method of claim 13 wherein said heating is by means of radiant heating.

* * * * *